(12) United States Patent
Choi et al.

(10) Patent No.: US 10,931,305 B2
(45) Date of Patent: Feb. 23, 2021

(54) DATA SERIALIZATION CIRCUIT

(71) Applicants: SK hynix Inc., Icheon (KR); Seoul National University R&DB Foundation, Seoul (KR)

(72) Inventors: Hong Seok Choi, Seoul (KR); Jeongho Hwang, Seoul (KR); Hyungrok Do, Seoul (KR); Deog-Kyoon Jeong, Seoul (KR)

(73) Assignees: SK hynix Inc., Icheon (KR); Seoul National University R&DB Foundation, Seoul (KR)

( * ) Notice: Subject to any disclaimer, the term of this patent is extended or adjusted under 35 U.S.C. 154(b) by 0 days.

(21) Appl. No.: 16/660,653

(22) Filed: Oct. 22, 2019

(65) Prior Publication Data

US 2020/0321977 A1 Oct. 8, 2020

(30) Foreign Application Priority Data

Apr. 5, 2019 (KR) .................. 10-2019-0040022

(51) Int. Cl.
| | |
|---|---|
| *H03M 9/00* | (2006.01) |
| *H03K 5/13* | (2014.01) |
| *H03K 17/687* | (2006.01) |
| *H03K 3/037* | (2006.01) |
| *H03K 19/20* | (2006.01) |
| *H03K 5/00* | (2006.01) |
| *H04B 1/04* | (2006.01) |
| *H04N 1/32* | (2006.01) |

(52) U.S. Cl.
CPC .............. *H03M 9/00* (2013.01); *H03K 3/037* (2013.01); *H03K 5/13* (2013.01); *H03K 17/6871* (2013.01); *H03K 19/20* (2013.01); *H03K 2005/00019* (2013.01); *H04B 1/04* (2013.01); *H04N 1/32475* (2013.01)

(58) Field of Classification Search
CPC ........ H04N 1/32475; H03M 2201/526; H03M 9/00; H04B 1/04
USPC .................................. 341/101, 100; 710/71
See application file for complete search history.

(56) References Cited

U.S. PATENT DOCUMENTS

| | | | |
|---|---|---|---|
| 6,525,571 B2 | 2/2003 | Green | |
| 7,661,010 B2 * | 2/2010 | DeFazio | ................. G11C 7/222 |
| | | | 713/500 |
| 2002/0175740 A1 * | 11/2002 | Ruegg | .................. H03K 17/693 |
| | | | 327/408 |

FOREIGN PATENT DOCUMENTS

KR 20170046423 A 5/2017

OTHER PUBLICATIONS

Bae, et al., "A 6-to-32 Gb/s Voltage-Mode Transmitter with Scalable Supply, Voltage Swing, and Pre-Emphasis in 65-nm CMOS," Proc. IEEE Asian Solid-State Circuits Conf., 2016, pp. 241-244.

* cited by examiner

*Primary Examiner* — Joseph J Lauture

(57) ABSTRACT

A data serialization circuit includes a clock data operation circuit configured to generate a plurality of delay clock signals and a plurality of synchronous data signals in response to a plurality of parallel data signals and a plurality of multi-phase clock signals and a multiplexer configured to output a serial data signal in response to the plurality of delay clock signals and the plurality of synchronous data signals. A first one of the plurality of delay clock signals substantially aligns with a first one of the plurality of synchronous data signals.

20 Claims, 4 Drawing Sheets

DATA SERIALIZATION CIRCUIT

CROSS-REFERENCE TO RELATED APPLICATION

The present application claims priority under 35 U.S.C. § 119(a) to Korean Patent Application No. 10-2019-0040022, filed on Apr. 5, 2019, which is incorporated herein by reference in its entirety.

BACKGROUND

1. Technical Field

Various embodiments may relate to a data serialization circuit for converting parallel data into serial data and outputting the serial data.

2. Related Art

In order to increase the bandwidth of data that can be transmitted via a single output pin, a plurality of data provided in parallel may be converted into serial data.

This is done by a serialization circuit, for example, a 2-to-1 or a 4-to-1 serialization circuit, in a high-speed transmitter circuit.

In case of a 2-to-1 serialization circuit, first data is output when a first clock signal of a pair of differential clock signals has a logic high value (e.g., 1) and second data is output when a second clock signal of the pair of differential clock signals has 1 so that two parallel data are converted into serial data.

In case of a 4-to-1 serialization circuit, each of four parallel data is output in synchronization with a clock signal having a corresponding phase among 4-phase clock signals to generate parallel data.

A 4-to-1 serialization circuit is beneficial in that a frequency of a clock signal to achieve the same data rate as a 2-to-1 serialization circuit is a half of a frequency of a clock signal of the 2-to-1 serialization circuit.

However, in a system including a conventional serialization circuit, when the number of clock signals having different phases increases, complexity of the system increases, mismatch occurs between data paths, and it becomes difficult to secure a bandwidth in a circuit to combine parallel data.

For example, the number of transistors connected in series between a power supply and a ground increases in a component of the conventional serialization circuit, which lowers a bandwidth and an operation speed, thereby becoming unsuitable for a high-speed data serialization circuit.

SUMMARY

In accordance with an embodiment of the present disclosure, a semiconductor device may include a clock data operation circuit configured to generate a plurality of delay clock signals and a plurality of synchronous data signals in response to a plurality of parallel data signals and a plurality of multi-phase clock signals; and a multiplexer configured to output a serial data signal in response to the plurality of delay clock signals and the plurality of synchronous data signals, wherein a first one of the plurality of delay clock signals substantially aligns with a first one of the plurality of synchronous data signals.

In accordance with an embodiment of the present disclosure, a method may include generating a plurality of delay clock signals and a plurality of synchronous data signals in response to a plurality of parallel data signals and a plurality of multi-phase clock signals; and generating a serial data signal in response to the plurality of delay clock signals and the plurality of synchronous data signals, wherein a first one of the plurality of delay clock signals substantially aligns with a first one of the plurality of synchronous data signals.

In accordance with an embodiment of the present disclosure, a data serialization circuit may include a clock data operation circuit including a first operation circuit and a second operation circuit, the first operation circuit generating a first synchronous data signal and a first delay clock signal in response to a first clock signal and a first parallel data signal, the second operation circuit generating a second synchronous data signal and a second delay clock signal in response to a second clock signal and a second parallel data signal; and a multiplexer including a first sub pull-down circuit configured to pull down an output signal at an output terminal in response to the first synchronous data signal and the second delay clock signal.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments that include various features, and explain various principles and beneficial aspects of those embodiments.

DETAILED DESCRIPTION

Various embodiments will be described below with reference to the accompanying figures. Embodiments are provided for illustrative purposes and other embodiments that are not explicitly illustrated or described are possible. Further, modifications can be made to embodiments of the present disclosure that will be described below in detail.

Figure 1:
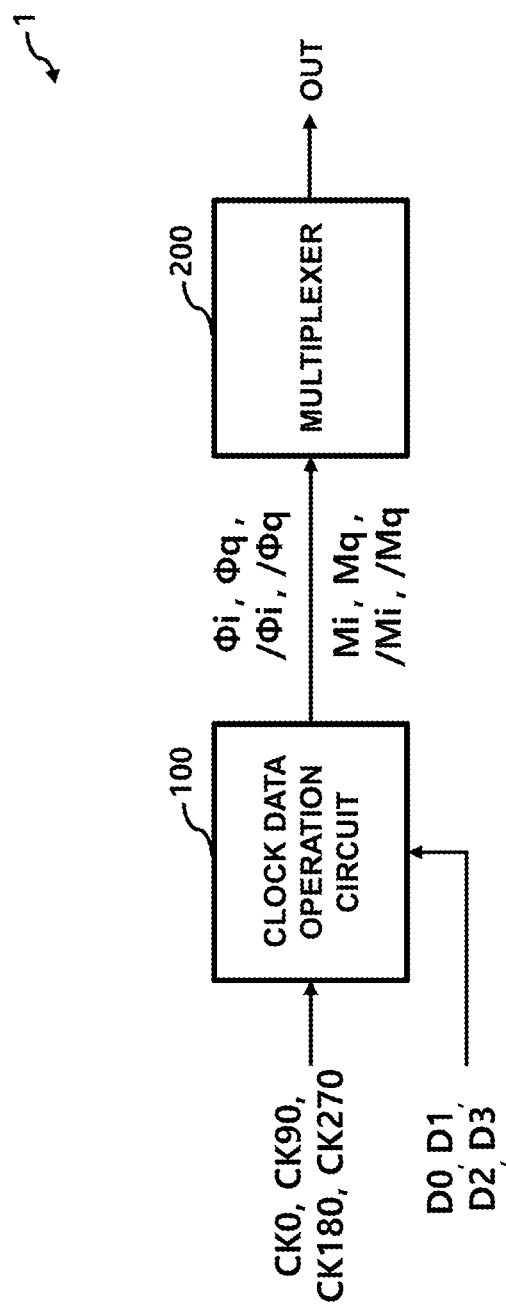
FIG. 1 illustrates a data serialization circuit according to an embodiment.

FIG. 1 illustrates a data serialization circuit 1 according to an embodiment of the present disclosure.

The data serialization circuit 1 includes a clock data operation circuit 100 and a multiplexer 200.

The clock data operation circuit 100 combines multi-phase clock signals CK0, CK90, CK180, and CK270 with parallel data signals D0, D1, D2, and D3 to generate synchronous data signals Mi, Mq, /Mi, and /Mq.

In this case, the multi-phase clock signals CK0, CK90, CK180, and CK270 are four-phase clock signals CK0, CK90, CK180, and CK270.

In an embodiment, the four-phase clock signals CK0, CK90, CK180, and CK270 are a first clock signal CK0 having a phase of 0 degree, a second clock signal CK90 having a phase of 90 degrees, a third clock signal CK180 having a phase of 180 degrees, and a fourth clock signal CK270 having a phase of 270 degrees. Specifically, each pair of subsequent ones of the four-phase clock signals CK0, CK90, CK180, and CK270 have a phase difference of 90 degrees relative to each other.

In this embodiment, the parallel data signals D0, D1, D2, and D3 are a first data signal D0, a second data signal D1, a third data signal D2, and a fourth data signal D3.

In this embodiment, the synchronous data signals Mi, Mq, /Mi, and /Mq are a first synchronous data signal Mi, a second synchronous data signal Mq, a third synchronous data signal /Mi, and a fourth synchronous data signal /Mq.

The first synchronous data signal Mi corresponds to a signal obtained by performing an AND operation on the first clock signal CK0 and the first data signal D0, and has a given phase difference relative to the first clock signal CK0.

The second synchronous data signal Mq corresponds to a signal obtained by performing an AND operation on the second clock signal CK90 and the second data signal D1, and has a given phase difference relative to the second clock signal CK90.

The third synchronous data signal /Mi corresponds to a signal obtained by performing an AND operation on the third clock signal CK180 and the third data signal D2, and has a given phase difference relative to the third clock signal CK180.

The fourth synchronous data signal /Mq corresponds to a signal obtained by performing an AND operation on the fourth clock signal CK270 and the fourth data signal D3, and has a given phase difference relative to the fourth clock signal CK270.

The clock data operation circuit 100 delays the multi-phase clock signals CK0, CK90, CK180, and CK270 as much as phase differences between the multi-phase clock signals CK0, CK90, CK180, and CK270 and the synchronous data signals Mi, Mq, /Mi, and /Mq and outputs multi-phase delay clock signals Φi, Φq, /Φi, and /Φq, respectively. For example, the clock data operation circuit 100 generates a first delay clock signal Φi by delaying the first clock signal CK0 with a delay amount substantially equal to a phase difference between the first clock signal CK0 and the first synchronous data signal Mi, generates a second delay clock signal Φq by delaying the second clock signal CK90 with a delay amount substantially equal to a phase difference between the second clock signal CK90 and the second synchronous data signal Mq, and so on.

The first delay clock signal Φi is generated by delaying the first clock signal CK0 to be aligned with the first synchronous data signal Mi.

The second delay clock signal Φq is generated by delaying the second clock signal CK90 to be aligned with the second synchronous data signal Mq.

The third delay clock signal /Φi is generated by delaying the third clock signal CK180 to be aligned with the third synchronous data signal /Mi.

The fourth delay clock signal /Φq is generated by delaying the fourth clock signal CK270 to be aligned with the fourth synchronous data signal Mq.

The multiplexer 200 uses the synchronous data signals Mi, Mq, /Mi, and /Mq and the delay clock signals Φi, Φq, /Φi, and /Φq to output a serial data signal OUT.

The configuration and operation of the clock data operation circuit 100 and the multiplexer 200 will be described below in more detail.

Figure 2:
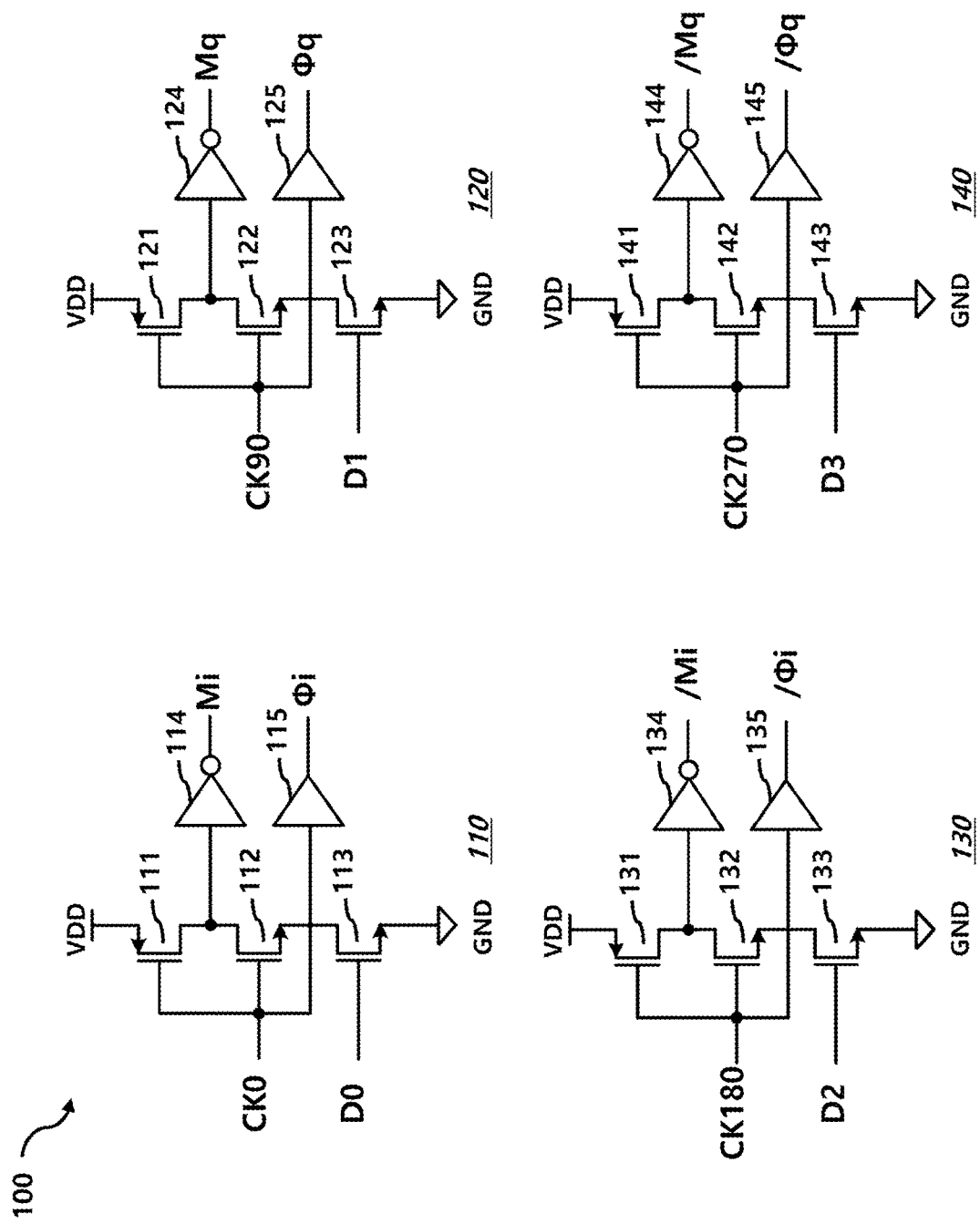
FIG. 2 illustrates a clock data operation circuit according to an embodiment.

FIG. 2 illustrates a clock data operation circuit 100 according to an embodiment of the present disclosure.

The clock data operation circuit 100 includes first, second, third, and fourth operation circuits 110, 120, 130, and 140.

The first operation circuit 110 includes a PMOS transistor 111 and NMOS transistors 112 and 113 connected in series between a power supply VDD and a ground GND.

A first clock signal CK0 is input to gates of the PMOS transistor 111 and the NMOS transistor 112, and a first data signal D0 is input to the gate of the NMOS transistor 113.

The first operation circuit 110 includes an inverter 114 for inverting a signal generated at a node commonly coupled to a drain of the PMOS transistor 111 and a drain of the NMOS transistor 112 to output a first synchronous data signal Mi.

The first operation circuit 110 includes a buffer 115 for buffering the first clock signal CK0 and outputting the first delay clock signal Φi.

The buffer 115 adjusts a delay amount so that edges of the first synchronous data signal Mi and the first delay clock signal Φi are substantially aligned. Specifically, the buffer 115 delays the first clock signal CK0 with a given delay amount to substantially align a rising edge of the first synchronous data signal Mi with a rising edge of the first delay clock signal Φi and substantially align a falling edge of the first synchronous data signal Mi with a falling edge of the first delay clock signal Φi. For example, a phase difference between a starting point of the rising edge of the first synchronous data signal Mi and a starting point of the rising edge of the first delay clock signal Φi is equal to or less than 3° or 1°.

The second, third, and fourth operation circuits 120, 130, and 140 each have substantially the same structure as the first operation circuit 110.

The second operation circuit 120 includes a PMOS transistor 121 and NMOS transistors 122 and 123 connected in series between a power supply VDD and a ground GND.

A second clock signal CK90 is input to gates of the PMOS transistor 121 and the NMOS transistor 122, and a second data signal D1 is input to the gate of the NMOS transistor 123.

The second operation circuit 120 includes an inverter 124 for inverting a signal generated at a node commonly coupled to a drain of the PMOS transistor 121 and a drain of the NMOS transistor 122 to output a second synchronous data signal Mq.

The second operation circuit 120 includes a buffer 125 for buffering the second clock signal CK90 and outputting the second delay clock signal Φq.

The buffer 125 adjusts a delay amount so that edges of the second synchronous data signal Mq and the second delay clock signal Φq are substantially aligned.

The third operation circuit 130 includes a PMOS transistor 131 and NMOS transistors 132 and 133 connected in series between a power supply VDD and a ground GND.

A third clock signal CK180 is input to gates of the PMOS transistor 131 and the NMOS transistor 132, and a third data signal D2 is input to the gate of the NMOS transistor 133.

The third operation circuit 130 includes an inverter 134 for inverting a signal generated at a node commonly coupled to a drain of the PMOS transistor 131 and a drain of the NMOS transistor 132 to output a third synchronous data signal /Mi.

The third operation circuit 130 includes a buffer 135 for buffering the third clock signal CK180 and outputting the third delay clock signal /Φi.

The buffer 135 adjusts a delay amount so that edges of the third synchronous data signal /Mi and the third delay clock signal /Φi are substantially aligned.

The fourth operation circuit 140 includes a PMOS transistor 141 and NMOS transistors 142 and 143 connected in series between a power supply VDD and a ground GND.

A fourth clock signal CK270 is input to gates of the PMOS transistor 141 and the NMOS transistor 142 and a fourth data signal D3 is input to the gate of the NMOS transistor 143.

The fourth operation circuit 140 includes an inverter 144 for inverting a signal generated at a node coupled to a drain of the PMOS transistor 141 and a drain of the NMOS transistor 142 to output a fourth synchronous data signal /Mq.

The fourth operation circuit 140 includes a buffer 145 for buffering the fourth clock signal CK270 and outputting the fourth delay clock signal /Φq.

The buffer 145 adjusts a delay amount so that edges of the fourth synchronous data signal /Mq and the fourth delay clock signal /Φq are substantially aligned.

In the embodiment shown in FIG. 2, the first synchronous data signal Mi corresponds to a signal obtained by performing an AND operation on the first clock signal CK0 and the first data signal D0.

Figure 4:
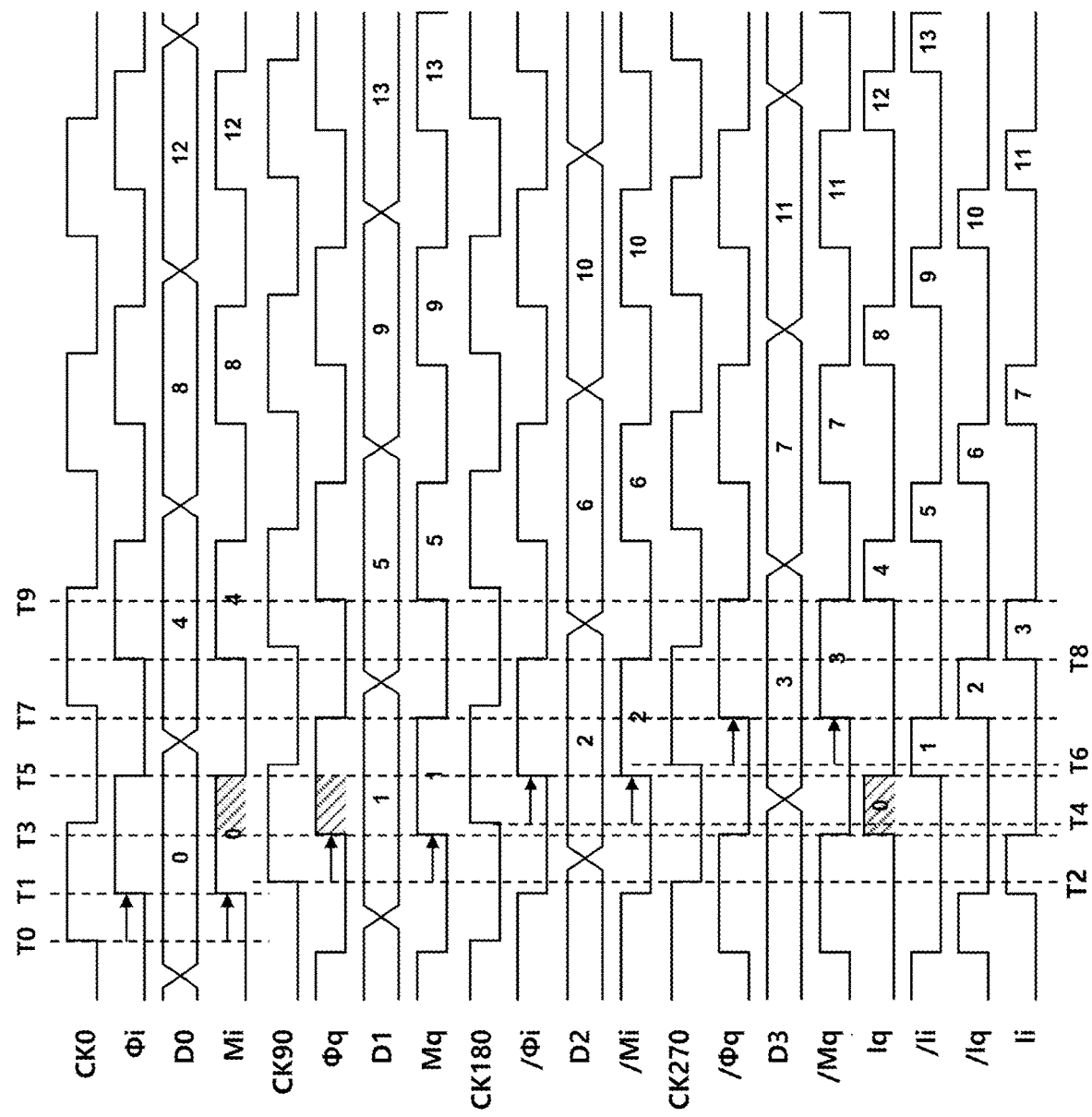
FIG. 4 illustrates an operation of a data serialization circuit according to an embodiment.

The first synchronous data signal Mi has a phase difference (e.g., a time interval between a first time T0 and a second time T1 in FIG. 4) relative to the first clock signal CK0. The buffer 115 delays the first clock signal CK0 by a delay amount corresponding to the phase difference, thereby generating the first delay clock signal Φi that is substantially aligned with the first synchronous data signal Mi at a specific time (e.g., the first time T1 in FIG. 4).

Hereinafter, the PMOS transistor 111, the NMOS transistors 112 and 113, and the inverter 114 of the first operation circuit 110 may be referred to as a first synchronous data generation circuit, and the buffer 115 of the first operation circuit 110 may be referred to as a first delay circuit.

In the embodiment shown in FIG. 2, the second synchronous data signal Mq corresponds to a signal obtained by performing an AND operation on the second clock signal CK90 and the second data signal D1.

The second synchronous data signal Mq has a phase difference (e.g., a time interval between a third time T2 and a fourth time T3 in FIG. 4) from the second clock signal CK90. The buffer 125 delays the second clock signal CK90 by a delay amount corresponding to the phase difference, thereby generating the second delay clock signal Φq that is substantially aligned with the second synchronous data signal Mq at a specific time (e.g., the fourth time T3 in FIG. 4).

Hereinafter, the PMOS transistor 121, the NMOS transistors 122 and 123, and the inverter 124 of the second operation circuit 120 may be referred to as a second synchronous data generation circuit, and the buffer 125 of the second operation circuit 120 may be referred to as a second delay circuit.

In the embodiment shown in FIG. 2, the third synchronous data signal /Mi corresponds to a signal obtained by performing an AND operation on the third clock signal CK180 and the third data signal D2.

The third synchronous data signal /Mi has a phase difference (e.g., a time interval between a fifth time T4 and a sixth time T5 in FIG. 4) relative to the third clock signal CK180.

The buffer 135 delays the third clock signal CK180 by a delay amount corresponding to the phase difference, thereby generating the third delay clock signal /Φi that is substantially aligned with the third synchronous data signal /Mi at a specific time (e.g., the sixth time T5 in FIG. 4).

Hereinafter, the PMOS transistor 131, the NMOS transistors 132 and 133, and the inverter 134 may be referred to as a third synchronous data generation circuit, and the buffer 135 may be referred to as a third delay circuit.

In the embodiment shown in FIG. 2, the fourth synchronous data signal /Mq corresponds to a signal obtained by performing an AND operation on the fourth clock signal CK270 and the fourth data signal D3.

The fourth synchronous data signal /Mq has a phase difference (e.g., a time between a seventh time T6 and an eighth time T7 in FIG. 4) from the fourth clock signal CK270.

The buffer 145 delays the fourth clock signal CK270 by a delay amount corresponding to the phase difference, thereby generating the fourth delay clock signal /Φq that is substantially aligned with the fourth synchronous data signal /Mq at a specific time (e.g., the eight time T7 in FIG. 4).

Hereinafter, the PMOS transistor 141, the NMOS transistors 142 and 143, and the inverter 144 may be referred to as a fourth synchronous data generation circuit, and the buffer 145 may be referred to as a fourth delay circuit.

Figure 3:
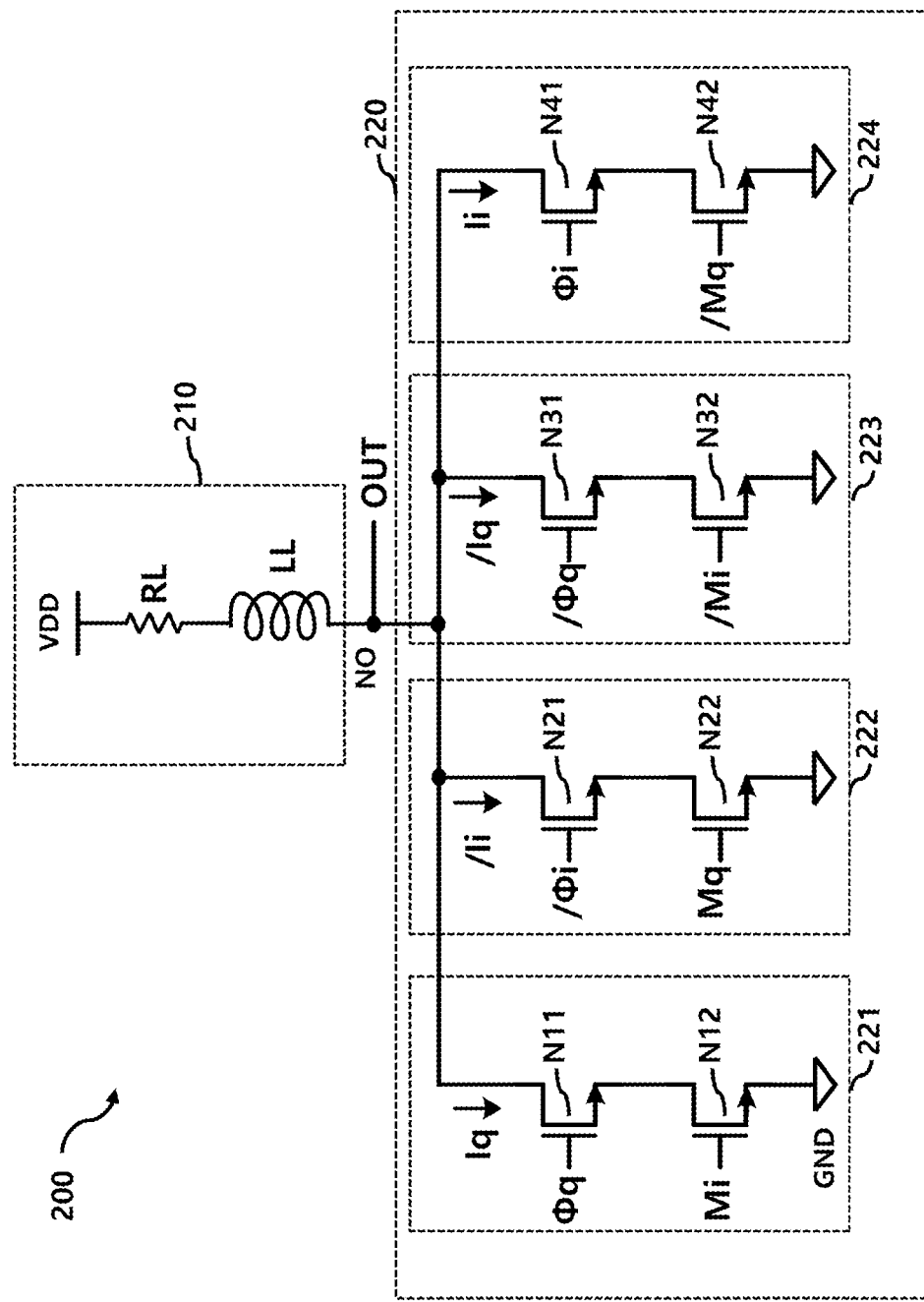
FIG. 3 illustrates a multiplexer according to other embodiment.

FIG. 3 illustrates a multiplexer 200 according to an embodiment of the present disclosure.

The multiplexer 200 includes a pull-up circuit 210 connected between a power supply VDD and an output terminal NO and a pull-down circuit 220 connected between the output terminal NO and a ground GND.

The pull-up circuit 210 includes a resistor RL and an inductor LL connected in series between the power supply VDD and the output terminal NO.

Although the pull-up circuit 210 according to the embodiment shown in FIG. 3 includes both the resistor RL and the inductor LL, embodiments of the present disclosure are not limited thereto. For example, the pull-up circuit 210 according to the embodiment shown in FIG. 3 includes only the resistor RL to decrease parasitic capacitance seen by the output terminal NO, compared to that of a conventional serialization circuit including one or more transistors that together perform a pulling-up operation. As a result, a bandwidth of a data serialization circuit (e.g., the data serialization circuit 1 in FIG. 1) including the pull-up circuit 210 according to the embodiment shown in FIG. 3 is increased compared to that of the conventional serialization circuit. The parasitic capacitance can be further reduced by using the resistor RL and the inductor LL that are coupled in series to each other in the pull-up circuit 210, thereby further increasing the bandwidth using series inductive peaking phenomenon.

The pull-down circuit 220 includes first, second, third, and fourth sub pull-down circuits 221, 222, 223, and 224.

The first sub pull-down circuit 221 includes NMOS transistors N11 and N12 connected in series between the output terminal NO and the ground GND.

The second delay clock signal Φq is input to the gate of the NMOS transistor N11 and the first synchronous data signal Mi is input to the gate of the N MOS transistor N12.

A first current Iq flows from the output terminal NO to the first sub pull-down circuit 221 in response to the second delay clock signal Φq and the first synchronous data signal Mi.

The first current Iq corresponds to a result of an AND operation on the second delay clock signal Φq and the first synchronous data signal Mi.

In an embodiment, a magnitude of the first current Iq corresponds to a logic value of the first synchronous data signal Mi in a time interval when the second delay clock signal Φq has a logic high value.

Specifically, the first current Iq is a signal corresponding to the first synchronous data signal Mi in a time interval between a fourth time T3 and a sixth time T5 of FIG. 4. For example, the first current Iq has a magnitude corresponding to a logic high value of the first synchronous data signal Mi in a time interval between the fourth time T3 and the sixth time T5 in FIG. 4 when the first synchronous data signal Mi and the second delay clock signal Φq each have a logic high value. At the sixth time T5, the NMOS transistor N12 receiving the first synchronous data signal Mi may be turned off to prevent the first current Iq from flowing through the NMOS transistor N12 while the NMOS transistor N11 receiving the second delay clock signal Φq remains turned on, and thus the switching operation of the NMOS transistor N12 may lead to an occurrence of a ripple in the output signal OUT at the output terminal NO. Because the NMOS transistor N12 is disposed farther from the output terminal NO than the NMOS transistor N11, such a ripple in the output signal OUT may be minimized in response to the edge of the first synchronous data signal Mi.

The second sub pull-down circuit 222 includes NMOS transistors N21 and N22 connected in series between the output terminal NO and the ground GND.

The third delay clock signal /Φi is input to the gate of the NMOS transistor N21 and the second synchronous data signal Mq is input to the gate of the NMOS transistor N22.

A second current/Ii flows from the output terminal NO to the second sub pull-down circuit 222 in response to the third delay clock signal/Φi and the second synchronous data signal Mq.

The second current/Ii corresponds to a result of an AND operation on the third delay clock signal /Φi and the second synchronous data signal Mq.

In an embodiment, a magnitude of the second current/Ii corresponds to a logic value of the second synchronous data signal Mq in a time interval when the third delay clock signal /Φi has a logic high value.

Specifically, the second current/Ii is a signal corresponding to the second synchronous data signal Mq in a interval between a sixth time T5 and an eight time T7 of FIG. 4. For example, the second current/Ii has a magnitude corresponding to a logic high value of the second synchronous data signal Mq in a time interval between the sixth time T5 and the eighth time T7 in FIG. 4 when the second synchronous data signal Mq and the third delay clock signal /Φi each have a logic high value.

The third sub pull-down circuit 223 includes NMOS transistors N31 and N32 connected in series between the output terminal NO and ground GND.

The fourth delay clock signal /Φq is input to the gate of the NMOS transistor N31 and the third synchronous data signal /Mi is input to the gate of the NMOS transistor N32.

A third current/Iq flows from the output terminal NO to the third sub pull-down circuit 223 in response to the fourth delay clock signal /Φq and the third synchronous data signal /Mi.

The third current/Iq corresponds to a result of an AND operation on the fourth delay clock signal /Φq and the third synchronous data signal /Mi.

In an embodiment, a magnitude of the third current/Iq corresponds to a logic value of the third synchronous data signal /Mi in a time interval when the fourth delay clock signal /Φq has a logic high value.

Specifically, the third current/Iq is a signal corresponding to the third synchronous data signal /Mi in a time interval between the eight time T7 and a ninth time T8 of FIG. 4. For example, the third current/Iq has a magnitude corresponding to a logic high value of the third synchronous data signal /Mi in a time interval between the eight time T7 and the ninth time T8 in FIG. 4 when the third synchronous data signal /Mi and the fourth delay clock signal /Φq each have a logic high value.

The fourth sub pull-down circuit 224 includes NMOS transistors N41 and N42 connected in series between the output terminal NO and ground GND.

The first delay clock signal Φi is input to the gate of the NMOS transistor N41 and the fourth synchronous data signal /Mq is input to the gate of the NMOS transistor N42.

A fourth current Ii flows from the output terminal NO to the fourth sub pull-down circuit 224 in response to the first delay clock signal Φi and the fourth synchronous data signal /Mq.

The fourth current Ii corresponds to a result of an AND operation of the first delay clock signal Φi and the fourth synchronous data signal /Mq.

In an embodiment, a magnitude of the fourth current Ii corresponds to a logic value of the fourth synchronous data signal /Mq in a time interval when the first delay clock signal Φi has a logic high value.

Specifically, the fourth current Ii is a signal corresponding to the fourth synchronous data signal /Mq in a time interval between the ninth time T8 and a tenth time T9 in FIG. 4. For example, the fourth current Ii has a magnitude corresponding to a logic high value of the fourth synchronous data signal /Mq in a time interval between the ninth time T8 and the tenth time T9 in FIG. 4 when the fourth synchronous data signal /Mq and the first delay clock signal Φi each have a logic high value.

The signal generated at the output terminal NO is a sum of the first, second, third and fourth currents Iq, /Ii, /Iq, and Ii, and as a result, the output signal OUT of the multiplexer 200 corresponds to a signal obtained by serializing the first, second, third, and fourth data signals D0, D1, D2, and D3 input in parallel.

A data serialization circuit (e.g., the data serialization circuit 1 in FIG. 1) according to an embodiment of the present disclosure includes a clock data operation circuit (e.g., the clock data operation circuit 100 in FIG. 2) and a multiplexer (e.g., the multiplexer 200 in FIG. 3). For example, the clock data operation circuit includes a plurality of operation circuits, each (e.g., the first operation circuit 110 in FIG. 2) of which performs a first AND operation on one (e.g., the first data signal D0 in FIG. 2) of a plurality of parallel data signals and a first clock signal (e.g., the first clock signal CK0 in FIG. 2). The multiplex includes a plurality of sub pull-down circuits, each (e.g., the first sub pull-down circuit 221 in FIG. 3) of which performs a second AND operation on a signal (e.g., the first synchronous data signal Mi in FIG. 2) corresponding to the one of the plurality of parallel data signals and a signal (e.g., the second delay clock signal Φq in FIG. 3) corresponding to a second clock signal (e.g., the second clock signal CK90 in FIG. 2) having a phase difference of 90° relative to the first clock signal. Such a data serialization circuit according to an embodiment includes the number of transistors connected in series between the power supply VDD and the ground GND smaller than that of a conventional data serialization circuit, thereby increasing an operation speed compared to the conventional data serialization circuit. In addition, the multiplexer according to an embodiment of the present disclosure may include a plurality of NMOS transistors (e.g., NMOS transistors N11 and N12 in FIG. 3), each of which having a faster operation speed than a corresponding one of a plurality of PMOS transistors included in the conventional data serialization circuit, thereby further increasing the operation speed compared to the conventional data serialization circuit.

In an embodiment, a pull-up circuit (e.g., the pull-up circuit 210 in FIG. 3) the multiplexer according to an embodiment may comprise a resistor (e.g., the resistor RL in FIG. 3), thereby increasing a bandwidth of the data serialization circuit. In an embodiment, such a pull-up circuit further includes an inductor, thereby further increasing the bandwidth while performing a high-speed operation.

Although various embodiments have been described for illustrative purposes, various changes and modifications may be possible.

For example, although an embodiment has been described in which four parallel data are combined to serial data in the above description, it will be apparent to those skilled in the art that an embodiment for combining another number of parallel data into a serial data may be possible in light of disclosures and teachings of the present disclosure and this embodiment is also included in scope of the present disclosure.

What is claimed is:

1. A data serialization circuit, comprising:
   a clock data operation circuit configured to generate a plurality of delay clock signals and a plurality of synchronous data signals in response to a plurality of parallel data signals and a plurality of multi-phase clock signals; and
   a multiplexer configured to output a serial data signal in response to the plurality of delay clock signals and the plurality of synchronous data signals,
   wherein a first one of the plurality of delay clock signals substantially aligns with a first one of the plurality of synchronous data signals, and a second one of the plurality of delay clock signals substantially aligns with a second one of the plurality of synchronous data signals.

2. The data serialization circuit of claim 1, wherein the clock data operation circuit includes a plurality of operation circuits, the plurality of operation circuits including a first operation circuit, the first operation circuit including a first synchronous data generation circuit and a first delay circuit, the first synchronous data generation circuit configured to generate the first one of the plurality of synchronous data signals in response to a first one of the plurality of parallel data signals and a first one of the multi-phase clock signals, the first delay circuit configured to generate the first one of the delay clock signals by delaying the first one of the plurality of multi-phase clock signals.

3. The data serialization circuit of claim 2, wherein the first synchronous data generation circuit performs an AND operation on the first one of the plurality of multi-phase clock signals and the first one of the plurality of parallel data signals to generate the first one of the synchronous data signals.

4. The data serialization circuit of claim 3, wherein the first synchronous data generation circuit comprises:
   a PMOS transistor including a gate receiving the first one of the multi-phase clock signals and a source coupled to a power supply;
   a first NMOS transistor including a gate receiving the first one of the multi-phase clock signals and a drain coupled to a drain of the PMOS transistor;
   a second NMOS transistor including a gate receiving the first one of the parallel data signals, a drain coupled to a source of the first NMOS transistor, and a source coupled to a ground; and
   an inverter inverting a signal generated at a node coupled to the drain of the PMOS transistor and outputting the first one of the plurality of synchronous data signals.

5. The data serialization circuit of claim 1, wherein the multiplexer comprises:
   a pull-up circuit coupled between a power supply and an output terminal; and
   a pull-down circuit coupled between the output terminal and a ground, and
   wherein the pull-up circuit includes a resistor.

6. The data serialization circuit of claim 5, wherein the pull-up circuit further includes an inductor coupled to the resistor in series.

7. The data serialization circuit of claim 5, wherein the pull-down circuit comprises a plurality of sub pull-down circuits, the plurality of sub pull-down circuits including a first sub pull-down circuit, and
   wherein the first sub pull-down circuit pulls down a signal at the output terminal when the second one of the plurality of delay clock signals and the first one of the plurality of synchronous data signals each have a first logic value.

8. The data serialization circuit of claim 7, wherein the first sub pull-down circuit includes:
   a first NMOS transistor coupled between the output terminal and the ground and including a gate receiving the second one of the plurality of delay clock signals; and
   a second NMOS transistor coupled between the first NMOS transistor and the ground including a gate receiving the first one of the plurality of synchronous data signals.

9. The data serialization circuit of claim 8, wherein the first one of the synchronous data signals is generated based on a first one of the multi-phase clock signals and a first one of the plurality of parallel data signals, and
   wherein the second one of the plurality of delay clock signals is generated by delaying a second one of the multi-phase clock signals that has a given phase difference with respect to the first one of the multi-phase clock signal.

10. The data serialization circuit of claim 7, wherein the serial data signal has a value corresponding to a sum of a plurality of currents respectively flowing through the plurality of sub pull-down circuits.

11. A method, comprising:
    generating a plurality of delay clock signals and a plurality of synchronous data signals in response to a plurality of parallel data signals and a plurality of multi-phase clock signals; and
    generating a serial data signal in response to the plurality of delay clock signals and the plurality of synchronous data signals,
    wherein a first one of the plurality of delay clock signals substantially aligns with a first one of the plurality of synchronous data signals, and a second one of the plurality of delay clock signals substantially aligns with a second one of the plurality of synchronous data signals.

12. The method of claim 11, wherein generating the plurality of delay clock signals and the plurality of synchronous data signals includes:
    generating the first one of the plurality of synchronous data signals by performing a logical operation on a first one of the plurality of parallel data signals and a first one of the plurality of multi-phase clock signals; and generating the first one of the delay clock signals by delaying the first one of the plurality of multi-phase clock signals.

13. The method of claim 12, wherein the logical operation is an AND operation.

14. The method of claim 11, wherein the serial data signal is generated by a multiplexer, the multiplexer comprising:
a pull-up circuit coupled between a power supply and an output terminal; and
a pull-down circuit coupled between the output terminal and a ground, and
wherein the pull-up circuit includes a resistor.

15. The method of claim 14, wherein the pull-up circuit further includes an inductor coupled to the resistor in series.

16. The method of claim 14, generating the serial data signal includes:
pulling down a signal generated at the output terminal when the second one of the plurality of delay clock signals and the first one of the plurality of synchronous data signals each have a first logic value.

17. The method of claim 14, wherein the pull-down circuit includes a plurality of sub pull-down circuits, the plurality of sub pull-down circuits including a first sub pull-down circuit, and
wherein generating the serial data signal includes causing a current to flow through the first sub pull-down circuit to the ground by performing a logical operation on the second one of the plurality of delay clock signals and the first one of the plurality of synchronous data signals.

18. A data serialization circuit, comprising:
a clock data operation circuit including a first operation circuit and a second operation circuit, the first operation circuit generating a first synchronous data signal and a first delay clock signal in response to a first clock signal and a first parallel data signal, the second operation circuit generating a second synchronous data signal and a second delay clock signal in response to a second clock signal and a second parallel data signal; and
a multiplexer including a first sub pull-down circuit configured to pull down an output signal at an output terminal in response to the first synchronous data signal and the second delay clock signal.

19. The data serialization circuit of claim 18, wherein the first operation circuit performs a first AND operation on the first clock signal and the first parallel data signal to generate the first synchronous data signal, and
wherein the first sub pull-down circuit performs a second AND operation on the first synchronous data signal and the second delay clock signal.

20. The data serialization circuit of claim 18, wherein the multiplexer further includes a pull-up circuit, the pull-up circuit including a resistor and an inductor coupled to each other in series.

* * * * *